United States Patent
Choi et al.

(10) Patent No.: US 8,129,898 B2
(45) Date of Patent: Mar. 6, 2012

(54) FLEXIBLE ORGANIC ELECTRO-LUMINESCENCE DISPLAY DEVICE AND MANUFACTURING METHOD THEREOF

(75) Inventors: Nack Bong Choi, Seoul (KR); Juhn Suk Yoo, Goyang-si (KR)

(73) Assignee: LG. Display Co. Ltd., Seoul (KR)

( * ) Notice: Subject to any disclaimer, the term of this patent is extended or adjusted under 35 U.S.C. 154(b) by 201 days.

(21) Appl. No.: 12/338,089

(22) Filed: Dec. 18, 2008

(65) Prior Publication Data

US 2009/0278449 A1    Nov. 12, 2009

(30) Foreign Application Priority Data

May 6, 2008 (KR) .................. 10-2008-0041994

(51) Int. Cl.
*H01L 51/10* (2006.01)

(52) U.S. Cl. .................. 313/504; 313/506; 313/511

(58) Field of Classification Search ............ 313/504, 313/506, 511, 512
See application file for complete search history.

(56) References Cited

U.S. PATENT DOCUMENTS

| | | | |
|---|---|---|---|
| 7,136,133 B2 * | 11/2006 | Murai | 349/149 |
| 2003/0143423 A1 * | 7/2003 | McCormick et al. | 428/690 |
| 2005/0225238 A1 * | 10/2005 | Yamazaki | 313/506 |
| 2006/0163565 A1 * | 7/2006 | Park et al. | 257/40 |
| 2006/0202615 A1 * | 9/2006 | Murakami et al. | 313/506 |
| 2007/0132381 A1 * | 6/2007 | Hayashi et al. | 313/512 |
| 2008/0143249 A1 * | 6/2008 | Lee et al. | 313/504 |

* cited by examiner

*Primary Examiner* — Karabi Guharay
(74) *Attorney, Agent, or Firm* — Brinks Hofer Gilson & Lione

(57) ABSTRACT

A flexible organic electro-luminescence device is adapted to improve its flexibility and to completely and substantially exclude the intrusion of external moisture and/or oxygen. The flexible organic electro-luminescence device includes: a substrate of a thickness of about 0.05 mm~0.2 mm; a planarization layer on the substrate; a thin film transistor on the planarization layer; a passivation layer on the planarization layer and the thin film transistor, with a contact hole exposing a drain electrode of the thin film transistor; a reflective layer on the passivation layer; an anode electrode on the reflective layer, electrically connected to the drain electrode of the thin film transistor; a bank layer on the edge region of the anode electrode and the passivation layer, including an organic material; an organic light emitting layer on the anode electrode; a cathode electrode on the bank layer and the organic light emitting layer; and a seal layer on the cathode electrode, including an organic film, an inorganic film, an adhesive film and a protective film.

14 Claims, 3 Drawing Sheets

FLEXIBLE ORGANIC ELECTRO-LUMINESCENCE DISPLAY DEVICE AND MANUFACTURING METHOD THEREOF

RELATED APPLICATIONS

This application claims priority under 35 U.S.C. 119 to Korean Patent Application No. 10-2008-0041994, filed on May 6, 2008, which is hereby incorporated by reference in its entirety.

BACKGROUND

1. Field of the Disclosure

This disclosure relates to a flexible organic electro-luminescence display device, and more particularly, to an organic electro-luminescence display device with a maximized flexibility and a manufacturing method thereof.

2. Description of the Related Art

As the information society expands, display devices capable of displaying information have been widely developed. These display devices include liquid crystal display (LCD) devices, organic electro-luminescence display (OLED) devices, plasma display devices, field emission display devices and so on.

The display devices are recently required to reinforce flexibility. In accordance therewith, flexible display devices capable of bending are actively researched. Specifically, a flexible OLED device has the advantages of being capable of minimizing the thickness and reducing the electric power consumption, because it has an unnecessary back-light unit, in contrast to an LCD device.

Such a flexible OLED device is usually manufactured on a plastic substrate. However, the plastic substrate is limited in its use in the flexible OLED devices due to its temperature sensitivity.

For superior flexibility, the thickness of the substrate should be minimized. The minimized thickness of the substrate would allow the substrate to be bent, thereby making it difficult to feed into manufacturing equipment.

Moreover, the OLED device can be easily damaged as external moisture and/or oxygen can intrude.

BRIEF SUMMARY

A flexible OLED device includes: a substrate of a thickness of about 0.05 mm~0.2 mm; a planarization layer on the substrate; a thin film transistor on the planarization layer; a passivation layer, on the planarization layer and the thin film transistor, having a contact hole exposing a drain electrode of the thin film transistor; a reflective layer on the passivation layer; an anode electrode, on the reflective layer, electrically connected to the drain electrode of the thin film transistor; a bank layer, on the edge region of the anode electrode and the passivation layer, including an organic material; an organic light emitting layer on the anode electrode; a cathode electrode on the bank layer and the organic light emitting layer; and a seal layer, on the cathode electrode, including an organic film, an inorganic film, an adhesive film and a protective film.

A manufacturing method of a flexible OLED device according to another general aspect of the present embodiment includes: forming a planarization layer on a substrate of a thickness of about 0.4 mm~1 mm; forming a thin film transistor on the planarization layer; forming a passivation layer on the planarization layer and the thin film transistor to have a contact hole which exposes a drain electrode of the thin film transistor; forming a reflective layer on the passivation layer; forming an anode electrode electrically connected to the drain electrode of the thin film transistor on the reflective layer; forming a bank layer including an organic material, on the edge region of the anode electrode and the passivation layer; forming an organic light emitting layer on the anode electrode; forming a cathode electrode on the bank layer and the organic light emitting layer; forming a seal layer including an organic film, an inorganic film, an adhesive film and a protective film, on the cathode electrode; and etching the rear side of the substrate until the thickness of the substrate is in a range of about 0.05 mm~0.2 mm.

Other systems, methods, features and advantages will be, or will become, apparent to one with skill in the art upon examination of the following figures and detailed description. It is intended that all such additional systems, methods, features and advantages be included within this description, be within the scope of the invention, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated in and constitute a part of this application, illustrate embodiment(s) of the invention and together with the description serve to explain the disclosure. In the drawings.

DETAILED DESCRIPTION OF THE DRAWINGS AND THE PRESENTLY PREFERRED EMBODIMENTS

Reference will now be made in detail to the embodiments of the present disclosure, examples of which are illustrated in the accompanying drawings. Wherever possible, the same reference numbers will be used throughout the drawings to refer to the same or like parts.

Figure 1:
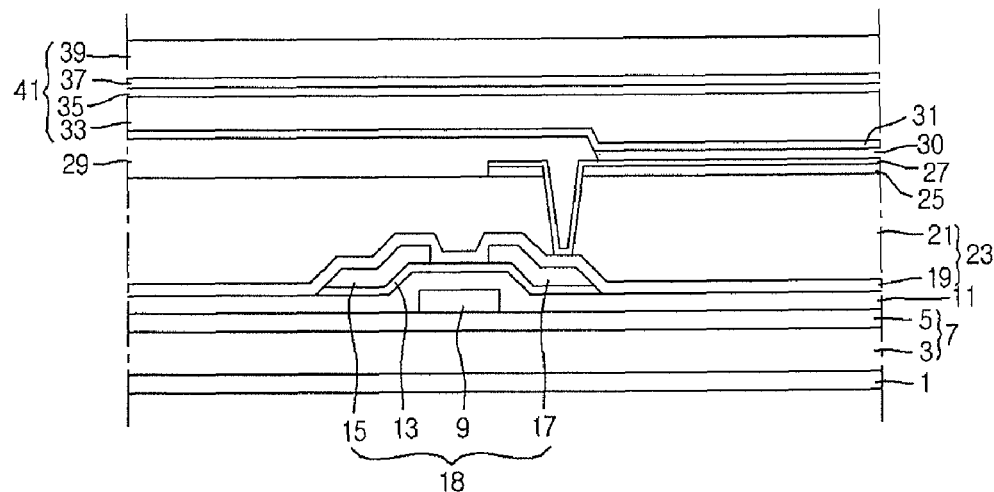
FIG. 1 is a sectional view showing a flexible OLED device according to an embodiment of the present disclosure.

FIG. 1 is a sectional view showing a flexible OLED device according to an embodiment of the present disclosure. Referring to FIG. 1, a planarization layer 7 is disposed on a substrate 1.

The substrate 1 may be made of a metal material such as stainless steel. In order to manufacture a flexible OLED device, an original substrate 1 should be feed into process equipment, as the substrate for the OLED device.

The original substrate 1 before being feed into the process equipment may be of a thickness in a range of about 0.4 mm to 1.0 mm. In accordance therewith, the original substrate 1 can not be flexible and maintain a planarization state. Such an original substrate 1 may be treated to have a range thickness of about 0.05 mm to 0.2 mm capable of being flexible by etching its rear side after the flexible OLED device is manufactured by means of the process equipment.

Figure 3A:
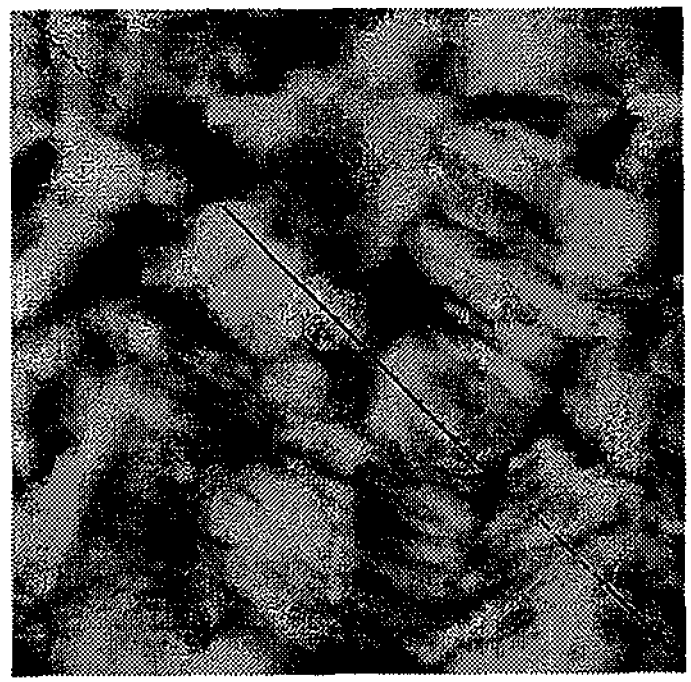
FIGS. 3A and 3B are views depicting the harshness of the surfaces of a substrate and a planarization layer included in a flexible OLED device according to an embodiment of the present disclosure.

The surface of the substrate 1 made of the metal material is very harsh, as shown in FIG. 3A. This harsh surface makes it difficult to manufacture the OLED device and changes characteristics of elements in the OLED device when the OLED device is manufactured by the following processes. Accordingly, the present embodiment can dispose the planarization layer 7 on the substrate 1 so as to correct the harshness of the surface of the substrate 1. The planarization layer 7 correcting the harshness of the surface of the substrate 1 implements a planarization of the surface of the substrate 1, so that elements can be easily manufactured by the following processes.

Figure 3B:
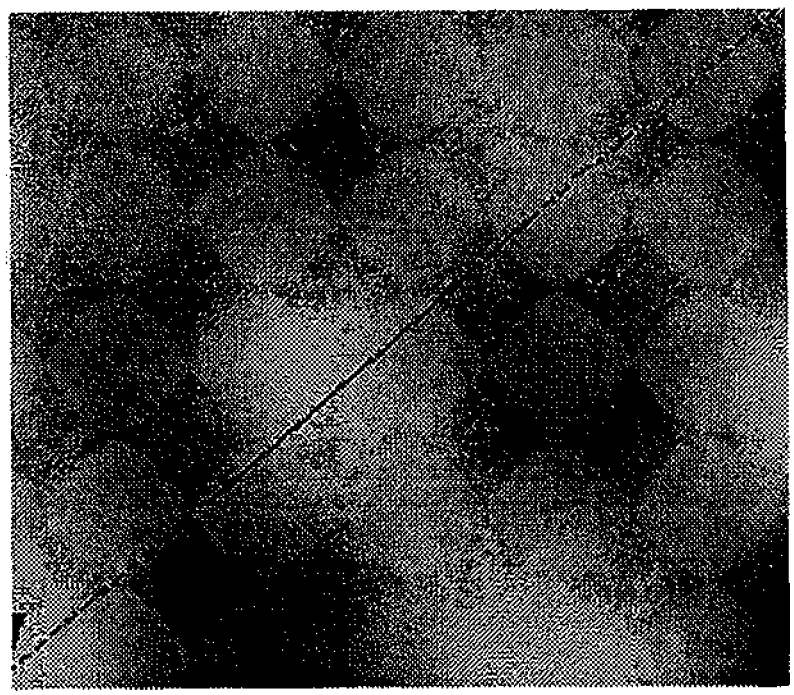

Such a planarization layer 7 can include an organic film 3 formed of an organic material and an inorganic film 5 formed of an inorganic material. The organic film 3 may include an organic material whose thickness is easily formed, and be formed in a thickness range of about 3 mm~5 mm, since it correct the harshness of the surface of the substrate 1. In accordance therewith, the surface of the organic film 3 is greatly lowed in harshness, as shown in FIG. 3B. Also, the organic film 3 may be formed of an organic material with a superior flexibility, thereby improving even more the flexibility of the flexible OLED device according to the present embodiment. Accordingly, the organic material forming such an organic film 3 may be any acryl group organic material or a polyimide. The organic film 3 formed as the above can be peeled off from the substrate 1 upon etching of gate electrode 9 which will be manufactured described below. Also, since organic outgas from the organic film 3 intrudes into the gate electrode 9, the characteristics of the gate electrode 9 deteriorate. In accordance therewith, the inorganic film 5 may be disposed on the organic film 3. The inorganic film can be thinly formed in a range of about 100 Å to 300 Å. The inorganic material forming the inorganic film 5 may be a silicon oxide SiOx, a silicon nitride SiNx, a silicon oxynitride SiOxNx, or an oxide of aluminum Al2O3. Consequently, the planarization layer includes a double film formed of the organic film 3 and the inorganic film 5.

On the planarization layer 7, a thin film transistor 18 is disposed. In other words, a gate electrode 9 is disposed on the planarization layer 7, a gate dielectric film 11 is disposed on the gate electrode 9, and a semiconductor layer 13, and source/drain electrodes 15 and 17 are disposed on the gate dielectric film 11 as opposed to the gate electrode 9. The semiconductor layer 13 may include an amorphous silicon (a-Si).

There is a passivation layer 23 disposed on both the planarization layer 7 and the thin film transistor 18. The passivation layer 23 may include a double film consisting of an inorganic film 19 of inorganic material and an organic film 21 of organic material. Unlike the double film structure, the passivation layer can include only a single film which is formed of only an inorganic material. The inorganic material may be the silicon oxide SiOx, the silicon nitride SiNx, the silicon oxide nitride SiOxNx, or the oxide of aluminum Al2O3. The organic material may include an acrylic organic material or a polyimide. The inorganic film 19 may have a thickness in a range of about 100 Å~3000 Å, and the organic film 21 may have a thickness in a range of about 500 Å~3 mm. The organic film 21 protects the thin film transistor 18. Also, the organic film 21 may be formed to have a planarization surface, thereby allowing the processes described below to be easily performed.

On the other hand, in the case where the passivation layer 23 consists of a single film formed of the inorganic material, the thickness of the passivation layer 23 may be in a range of about 500 Å~4000 Å.

On the passivation layer 23, a reflective layer 25 is disposed. The reflective layer 25 reflects lights, generated in an organic light emitting layer 30 which will is formed by the process described below, toward the front side. To this end, the reflective layer 25 can be formed of any material capable of reflecting light. The reflective layer 25 is provided with an anode electrode 27 disposed thereon. The anode electrode 27 may be electrically connected to the drain electrode 17 through the reflective layer 25 and the passivation layer 23. Also, the anode electrode 27 can be formed of a transparent metal material. For example, the anode electrode 27 may include an indium-tin-oxide or an indium-zinc-oxide. Such an anode electrode 27 transfers a signal from the thin film transistor 18 to the organic light emitting layer 30. Moreover, the reflective layer 25 and the anode electrode 27 may be arranged in a pixel region. The pixel region is defined by gate lines and data lines crossing each other. The OLED device according to the embodiment of the present disclosure allows the pixel regions to be arranged in the shape of a matrix and each pixel region to generate a light of any primary color. The primary color lights from the pixel regions are mixed with one another so as to realize full colors.

A bank layer 29 is disposed on the passivation layer 23 and the edge region of the anode electrode 27. The bank layer 29 defines the pixel regions and prevents the organic light emitting layer 30, which is opposite the edge of the anode electrode 27, from being damaged by a high electric field generated in the edge region of the anode 27. To this end, the bank layer 29 may be disposed on the passivation layer 23 between the pixel regions and on the edge of the anode electrode 27. Also, the bank layer 29 of the present embodiment may include an organic material. The organic material has a superior flexibility relative to an inorganic material. On the other hand, a bank layer 29 of inorganic material has an inferior flexibility and in bending causes a cathode electrode 31, which will be disposed thereon, to peel off. Accordingly, the present embodiment employs a bank layer 29 of organic material. The organic material for the bank layer 29 may be any acryl group organic material or a polyimide. Such a bank layer 29 may have a thickness in a range of about 500 Å~3 mm.

The organic light emitting layer 30 is disposed on the anode electrode 27 with the exception of the bank layer 29. The organic light emitting layer 30 includes a red organic light emitting film for emitting red lights, a green organic light emitting film for emitting green lights, and a blue organic light emitting film for emitting blue lights. These red, green and blue organic light emitting films may be arranged in the pixel regions, respectively.

The cathode electrode 31 is disposed on the bank layer 29 and the organic light emitting layer 30. The cathode electrode 31 may consist of a transparent metal material. For example, the cathode electrode can be formed of either an indium-tin-oxide or an indium-zinc-oxide.

A seal layer 41 which prevents moisture and/or oxygen from intruding into the organic light emitting layer 30 is disposed on the cathode electrode 31. The seal layer 41 can include at least one of organic film 33, inorganic film 35, adhesive film 37 and protective sheet 39.

The organic film 33 may include any one selected from a group consisting of small molecular organic materials such as LiF and Ca and high molecular organic materials such as acryl group material and polyimide. The organic film 33 should be formed to contact the bank layer 29 and the cathode electrode 31. The organic film 33 disposed in the present embodiment is a first layer of prevention from the intrusion of external moisture and oxygen into the bank layer 29 and the cathode electrode 31 in addition to greatly improving the flexibility and planarization of the OLED device. The thickness of such an organic film 33 may be in a range of about 200 Å~1000 Å.

The inorganic film 35 may be disposed in order to provide a secondary prevention from the intrusion of external moisture and/or oxygen. To this end, the inorganic film 35 should be formed of an inorganic material such as an aluminum oxide AlOx or a silicon oxide SiOx. The thickness of the inorganic film 35 should be in a range of about 500 Å~700 Å.

The adhesive film 37, which bonds the protective sheet 39 to the inorganic film 35, may include an adhesive material and a moisture absorbent. The moisture absorbent included in the adhesive film 35 may provide a third prevention from the intrusion of external moisture and/or oxygen.

The protective sheet 39 protects every element, including the organic light emitting layer 30 and being provided in the manufacturing processes, from damages such as scratching and so on. To this end, the protective sheet 39 may include a plastic material. Actually, the protective film 39 can be formed of any one of a polyethylene terephthalate, a polyimide, a polyether sulfone, a polystyrene and so on.

Accordingly, the seal layer 41 can completely and substantially exclude the intrusion of external moisture and/or oxygen, since each of the organic film 33, the inorganic film 35, the adhesive film 37 and the protective sheet 39 prevents external moisture and/or oxygen in stages. As a result, the seal layer 41 prevents an element defect caused by the intrusion of external moisture and/or oxygen.

FIGS. 2A to 2E are process views explaining processes of manufacturing a flexible OLED device according to another embodiment of the present disclosure. Firstly, a thick original plate (hereinafter, 'substrate') 1 having a thickness of about 0.4 mm~1 mm is provided. The substrate 1 is fed into process equipment for manufacturing an OLED device. To this end, the substrate 1 may be made of stainless steel.

Figure 2A:
FIG. 2A to 2E are process views explaining a manufacturing process of flexible OLED device according to an embodiment of the present disclosure.

As shown in FIG. 2A, A planarization layer 7 including an organic film 3 and an inorganic film 5 is provided on the fed substrate 1. The planarization layer 7 may be formed by firstly depositing the organic film 3 on the substrate 1 in a thickness range of about 3 mm~5 mm and secondly depositing the inorganic film 5 on the organic film 3 in a thickness range of about 100 Å~300 Å. The organic film 3 may include any one of the organic materials of an acrylic group and a polyimide, and the inorganic film 5 may include any one of a silicon oxide SiOx, a silicon nitride SiNx, a silicon oxide nitride SiOxNx and a oxide of aluminum Al2O3. The present embodiment uses the organic film 3 to correct the harshness of the surface of the substrate 1. Moreover, the present embodiment can improve more the flexibility of the OLED device by use of the organic film 3 which has a superior flexibility. The inorganic film 5 formed in the present embodiment prevents the peeling of the organic film 3 under the wet etching of gate electrode 9 which will be formed in the processes described below. Also, the inorganic film 5 prevents the intrusion of organic outgas from the organic film 3, into the gate electrode 9 and so on.

Figure 2B:
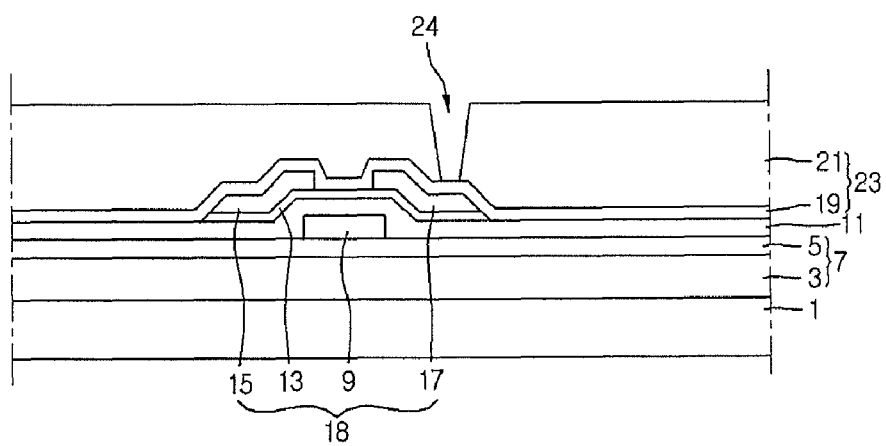

Referring to FIG. 2B, a thin film transistor 18 is formed on the planarization layer 7. In other words, a first metal material is deposited on the inorganic film 5 and patterned so that a gate line (not shown) and the gate electrode 9 are formed. A gate dielectric film 11 is formed on the gate electrode 9 through a process of depositing gate dielectric material. An amorphous silicon and a second metal material are sequentially deposited on the gate dielectric film 11 before their patterning, thereby forming a semiconductor layer 13 (i.e., a semiconductor pattern) and source/drain electrodes 15 and 17. A data line, which is not shown in FIG. 2, may be formed together with the source/drain electrodes 15 and 17. In accordance therewith, the thin film transistor 18 is configured to include the gate electrode 9, the semiconductor layer 13 and the source/drain electrodes 15 and 17.

A passivation layer 23 is formed on the planarization layer 7 and the thin film transistor 19. The passivation layer 23 may include a double layer structure consisting of an inorganic film 19 of inorganic material and an organic film 21 of organic material. The inorganic film 19 may be any one of a silicon oxide SiOx, a silicon nitride SiNx, a silicon oxide nitride SiOxNx and an oxide of aluminum Al2O3, and the organic film 21 may be any acryl group organic material or a polyimide. Also, the inorganic film 19 may have a thickness in a range of about 100 Å~3000 Å, and the organic film 21 may have a thickness in a range of about 500 Å~4 mm. The organic film 21 protects the thin film transistor 18. Moreover, the organic film 21 may be formed to have a planarization surface, so that the processes described below are easily performed. Alternatively, in the case where the passivation layer 23 consists of a single layer which has the inorganic film 19 of inorganic material, the thickness of the passivation layer 23 may be in a range of about 500 Å~4000 Å. Furthermore, the passivation layer 23 is provided with a contact hole 24 which exposes the drain electrode 17 of the thin film transistor 18.

Figure 2C:
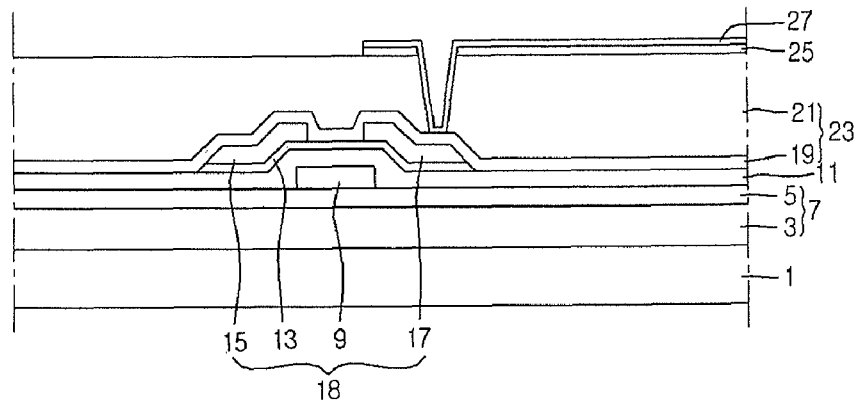

As shown in FIG. 2C, a reflective material is deposited and patterned on the passivation layer 23, thereby forming a reflective layer 25. The patterning process removes the reflective material on the rest regions with the exception of the pixel region, for example, on the gate line region, the data line region, the transistor region and the contact hole region. In other words, the reflective layer 25 is not formed on these regions including the gate line region, the data line region, the transistor region and the contact hole region. The reflective layer 25 can be formed of any material capable of reflecting lights generated in an organic light emitting layer 30 which will be formed in the process described below.

An anode electrode 27 is formed on the reflective layer 25 by depositing and patterning a first transparent material. The first transparent material may be an indium-tin-oxide or an indium-zinc-oxide. The anode electrode 27 can be electrically connected to the drain electrode 17 of the thin film transistor 18 via the contact hole 24.

The reflective layer 25 and the anode electrode 27 may be arranged only within a pixel region. The pixel region is defined by the gate line and the data line crossing each other. The OLED device allows the pixel regions to be repeatedly arranged in the shape of a matrix and the pixel regions to respectively generate primary color lights. The primary color lights generated in the pixel regions are mixed with one another so as to realize full colors.

Figure 2D:
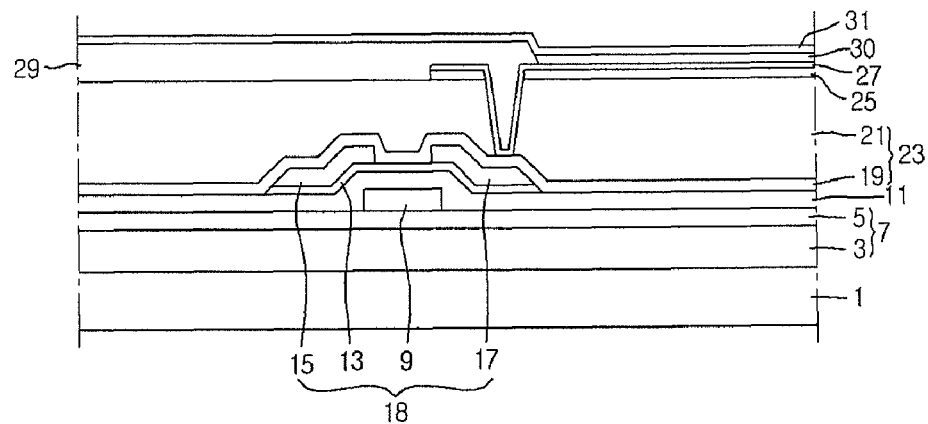

Referring to FIG. 2D, a bank layer 29 is formed on the passivation layer 23 between the pixel regions and on the edge region of the anode electrode 27 through processes of depositing an organic material on the reflective layer 25 and the anode electrode 27 and patterning the deposited organic material. The bank layer 29 defines the pixel region and prevents the organic light emitting layer 30, which is opposite the edge of the anode electrode 27, from being damaged by a high electric field generated in the edge region of the anode.

The bank layer 29 in the present embodiment may be formed of an organic material having a superior flexibility relative to an inorganic material. If the bank layer 29 includes the inorganic material, the bank layer 29 can cause the cathode electrode 31, which will be disposed thereon, to peel off by bending of the OLED device because of its inferior flexibility. In view of this point, the present embodiment employs the bank layer 29 formed of the organic material such as any acryl group organic material or a polyimide. The bank layer 29 can have a thickness in a range of about 500 Å~3 mm.

The organic light emitting layer 30 is formed on the anode electrode 27 with the exception of the bank layer 29. The organic light emitting layer 30 includes a red organic light emitting layer for emitting a red light, a green organic light emitting layer for emitting a green light, and a blue organic light emitting layer for emitting a blue light. The red, green and blue organic light emitting layers may be arranged in the pixel regions, respectively.

The cathode electrode 29 is formed through a process of depositing a second transparent material on the bank layer 29 and the organic light emitting layer 30. The second transparent material may be an indium-tin-oxide or an indium-zinc-oxide.

Figure 2E:
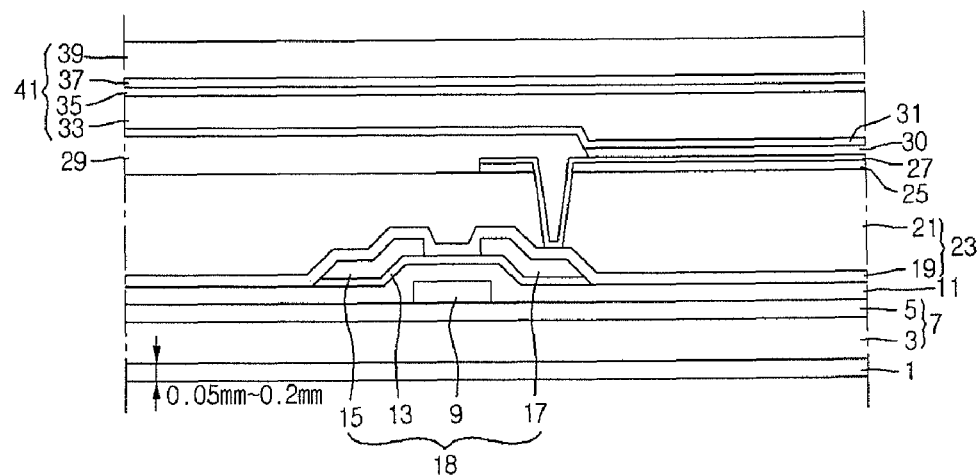

As shown in FIG. 2E, a seal layer 41 which prevents moisture and/or oxygen from intruding into the organic light emitting layer 30 is formed on the cathode electrode 31. In other words, an organic material is deposited in a thickness range of about 200 Å~1000 Å and then an inorganic material is deposited in a thickness range of about 500 Å~700 Å, thereby forming an organic film 33 and an inorganic film 35. The organic material may include any one selected a group consisting of small molecular organic materials such as LiF and Ca and high molecular organic materials such as acryl group materials and polyimide. Such an organic film 33 is disposed in order to firstly prevent the intrusion of external moisture and/or oxygen and to greatly improve the flexibility and planarization of the OLED device. The inorganic film 35 is disposed so as to secondarily prevent the intrusion of external moisture and/or oxygen. The inorganic film 35 may be formed of an inorganic material such as an oxide of aluminum AlOx or a silicon oxide SiOx.

Also, an adhesive film 37 can be formed on one of the inorganic film 35 and a protective sheet 39. The adhesive film 37, which bonds the protective sheet 39 to the inorganic film 35, may include an adhesive material and a moisture absorbent. The moisture absorbent included in the adhesive film 37 can thirdly prevent the intrusion of external moisture and/or oxygen.

In order to protect every element manufactured by the processes described above and including the organic light emitting layer 30, the protective sheet 39 can include a plastic material. For example, the protective sheet 39 may be formed of any one of a polyethylene terephthalate, a polyimide PI, a polyether sulfone and a polystyrene. The protective sheet 39 is attached to the surface of the inorganic film 35 by means of the adhesive film 37.

In accordance therewith, the seal layer 41 can be formed of the organic film 33, the inorganic film 35, the adhesive film and the protective film 39. Such a seal layer 41 can completely or substantially exclude the intrusion of external moisture and/or oxygen, since each of the organic film 33, the inorganic film 35, the adhesive film 37 and the protective film 39 prevents external moisture and/or oxygen in stages. Accordingly, the seal layer 41 prevents an element defect caused by the intrusion of external moisture and/or oxygen.

Finally, the rear side of the substrate 1 is etched to remove it rear side until the thickness of the substrate 1 is in a range of about 0.05 mm~0.2 mm. In accordance therewith, the substrate 1 can bent freely. As a result, the flexibility of the flexible OLED device improves even more.

As described above, the flexible OLED device and the manufacturing method thereof according to the present embodiment minimize the thickness of the substrate through an etching process. Accordingly, the flexibility of the flexible OLED device improves. Moreover, a bank layer included in the flexible OLED device is formed of an organic material having a superior flexibility. As a result, the flexibility of the flexible OLED device improves even more.

Also, the flexible OLED device and the manufacturing method thereof according to the present embodiment allow a planarization layer to be formed of an organic material, thereby minimizing the harshness of the surface of metal substrate.

Furthermore, the flexible OLED device and the manufacturing method thereof according to the present embodiment form a seal layer which includes an organic film, an inorganic film, an adhesive film and a protective film each having an intrusion preventing function. As a result, the intrusion of external moisture and/or oxygen into the flexible OLED device can be completely and substantially excluded.

It will be apparent to those skilled in the art that various modifications and variations can be made in the present disclosure. Thus, it is intended that the present disclosure cover the modifications and variations of this invention provided they come within the scope of the appended claims and their equivalents.

The invention claimed is:

1. A flexible organic electro-luminescence device comprising:
   a substrate of thickness of about 0.05 mm~0.2 mm;
   a planarization layer on the substrate;
   a thin film transistor on the planarization layer;
   a passivation layer on the planarization layer and the thin film transistor, having a contact hole exposing a drain electrode of the thin film transistor;
   a reflective layer on the passivation layer;
   an anode electrode on the reflective layer, electrically connected to the drain electrode of the thin film transistor;
   a bank layer on the edge region of the anode electrode and the passivation layer, including an organic material;
   an organic light emitting layer on the anode electrode;
   a cathode electrode on both the bank layer and the organic light emitting layer; and
   a seal layer on the cathode electrode, including an organic film, an inorganic film, an adhesive film and a protective film,
   wherein the reflective layer is removed in the region corresponding to the contact hole,
   wherein the organic film, the inorganic film, the adhesive film and the protective film are sequentially formed on a whole side of the cathode electrode such that the films are stacked above the cathode electrode one another, and
   wherein the adhesive film includes a moisture absorbent,
   wherein the planarization layer includes,
   an organic film, on the substrate, having a thickness of about 3 mm~5 mm to compensate the harshness of the surface of the substrate; and
   an inorganic film, on the organic film, having a thickness of about 100 Å~300 Å.

2. The flexible organic electro-luminescence device claimed as claim 1, wherein the substrate includes stainless steel.

3. The flexible organic electro-luminescence device claimed as claim 1, wherein the passivation layer includes:
   an inorganic film disposed on the planarization layer and the thin film transistor, and having a thickness of about 100 Å~3000 Å; and an organic film disposed on the inorganic film to and having a thickness of about 500 Å~3 mm.

4. The flexible organic electro-luminescence device claimed as claim 1, wherein the bank layer is of a thickness of about 500 Å~3 mm.

5. The flexible organic electro-luminescence device claimed as claim 1, wherein the organic film of the seal layer is of a thickness of about 200 Å~1000 Å and the inorganic film of the seal layer is of a thickness of about 500 Å~700 Å.

6. The flexible organic electro-luminescence device claimed as claim 5, wherein the organic film includes one material selected from a group consisting of small molecular organic materials and high molecular organic materials, and the inorganic film includes one of an oxide of aluminum and a silicon oxide.

7. The flexible organic electro-luminescence device claimed as claim 1, wherein the anode and cathode electrodes include a transparent material.

8. A method of manufacturing a flexible organic electro-luminescence device, comprising:

forming a planarization layer on a substrate of a thickness of about 0.4 mm~1 mm;

forming a thin film transistor on the planarization layer;

forming a passivation layer on the planarization layer and the thin film transistor to have a contact hole which exposes a drain electrode of the thin film transistor;

forming a reflective layer on the passivation layer;

forming an anode electrode electrically connected to the drain electrode of the thin film transistor on the reflective layer;

forming a bank layer including an organic material, on the edge region of the anode electrode and the passivation layer;

forming an organic light emitting layer on the anode electrode;

forming a cathode electrode on the bank layer and the organic light emitting layer;

forming a seal layer including an organic film, an inorganic film, an adhesive film and a protective film, on the cathode electrode; and etching the rear side of the substrate until the thickness of the substrate is in a range of about 0.05 mm~0.2 mm, wherein the reflective layer is removed in the region corresponding to the contact hole, wherein the organic film, the inorganic film the adhesive film and the protective film are sequentially formed on a whole side of the cathode electrode such that the films are stacked above the cathode electrode one another, and wherein the adhesive film includes a moisture absorbent, wherein the planarization layer includes, an organic film, on the substrate, having a thickness of about 3 mm~5 mm to compensate the harshness of the surface of the substrate; and an inorganic film, on the organic film, having a thickness of about 100 Å~300 Å.

9. The method claimed as claim 8, wherein the substrate includes stainless steel.

10. The method claimed as claim 8, wherein the passivation layer includes:

an inorganic film disposed on the planarization layer and the thin film transistor, and having a thickness of about 100 Å~3000 Å; and an organic film disposed on the inorganic film to and having a thickness of about 500 Å~3 mm.

11. The method claimed as claim 8, wherein the bank layer is of a thickness of about 500 Å~3 mm.

12. The method claimed as claim 8, wherein the organic film of the seal layer is of a thickness of about 200 Å~1000 Å and the inorganic film of the seal layer is of a thickness of about 500 Å~700 Å.

13. The method claimed as claim 12, wherein the organic film includes one material selected from a group consisting of small molecular organic materials and high molecular organic materials, and the inorganic film includes one of an oxide of aluminum and a silicon oxide.

14. The method claimed as claim 8, wherein the anode and cathode electrodes include a transparent material.

* * * * *